(12) United States Patent
Zhou et al.

(10) Patent No.: US 8,434,367 B2
(45) Date of Patent: May 7, 2013

(54) ACOUSTIC SENSOR SYSTEM, ACOUSTIC SIGNATURE SIMULATOR, AND ELECTRICAL DISTRIBUTION SYSTEM

(75) Inventors: Xin Zhou, Franklin Park, PA (US); Thomas J. Schoepf, Whitefish Bay, WI (US)

(73) Assignee: Eaton Corporation, Cleveland, OH (US)

( * ) Notice: Subject to any disclaimer, the term of this patent is extended or adjusted under 35 U.S.C. 154(b) by 327 days.

(21) Appl. No.: 12/906,258

(22) Filed: Oct. 18, 2010

(65) Prior Publication Data
US 2012/0090396 A1 Apr. 19, 2012

(51) Int. Cl.
*G01H 5/00* (2006.01)
*G06G 7/48* (2006.01)

(52) U.S. Cl.
USPC .................................. 73/645; 73/649; 703/5

(58) Field of Classification Search ............. 73/645, 73/649; 324/537; 703/5
See application file for complete search history.

(56) References Cited

U.S. PATENT DOCUMENTS

| | | | |
|---|---|---|---|
| 6,114,971 A * | 9/2000 | Nysen | 340/10.3 |
| 6,300,767 B1 | 10/2001 | Kliman et al. | |
| 6,377,184 B1 | 4/2002 | Minker | |
| 6,687,110 B2 * | 2/2004 | Murray | 361/131 |
| 6,734,682 B2 * | 5/2004 | Tallman et al. | 324/528 |
| 7,148,696 B2 | 12/2006 | Zhou et al. | |
| 7,403,129 B2 | 7/2008 | Zhou et al. | |
| 7,411,403 B2 | 8/2008 | Zhou | |
| 2001/0017262 A1 | 8/2001 | Nakashima et al. | |
| 2003/0037615 A1 * | 2/2003 | Madaras et al. | 73/598 |
| 2007/0263329 A1 * | 11/2007 | Zhou et al. | 361/42 |

FOREIGN PATENT DOCUMENTS

| DE | 26 41 047 A1 | 3/1978 |
|---|---|---|
| FR | 1 181 357 A | 6/1959 |

OTHER PUBLICATIONS

European Patent Office, "extended European search report", Nov. 29, 2012, 6 pp.

* cited by examiner

*Primary Examiner* — J M Saint Surin
(74) *Attorney, Agent, or Firm* — Eckert Seamans Cherin & Mellott, LLC; Kirk D. Houser

(57) ABSTRACT

An acoustic sensor system includes a first plurality of acoustic sensors, and an acoustic transmitter structured to generate acoustic noise to mimic acoustic noise induced by an electrical conductivity fault. A smaller second number of acoustic sensors of the first plurality of acoustic sensors are structured to identify a plurality of locations in an electrical distribution system having a plurality of electrical joints, in order that the smaller second number of acoustic sensors can monitor the plurality of electrical joints of the electrical distribution system.

9 Claims, 8 Drawing Sheets

ACOUSTIC SENSOR SYSTEM, ACOUSTIC SIGNATURE SIMULATOR, AND ELECTRICAL DISTRIBUTION SYSTEM

CROSS-REFERENCE TO RELATED APPLICATIONS

This application is related to commonly assigned, copending U.S. patent application Ser. No. 12/906,244, filed Oct. 18, 2010, entitled "ACOUSTIC SENSOR SYSTEM FOR DETECTING ELECTRICAL CONDUCTIVITY FAULTS IN AN ELECTRICAL DISTRIBUTION SYSTEM" commonly assigned, copending U.S. patent application Ser. No. 12/906,256, filed Oct. 18, 2010, entitled "ACOUSTIC APPARATUS AND ACOUSTIC SENSOR APPARATUS INCLUDING A CLAMP"; and commonly assigned, copending U.S. patent application Ser. No. 12/906,259, filed Oct. 18, 2010, entitled "ACOUSTIC APPARATUS AND ACOUSTIC SENSOR APPARATUS INCLUDING A FASTENER".

BACKGROUND

1. Field

The disclosed concept pertains generally to acoustic noise induced by electrical conductivity faults and, more particularly, to acoustic sensor systems. The disclosed concept also pertains to acoustic signature simulators. The disclosed concept further pertains to electrical distribution systems.

2. Background Information

Known switchgears, switchboards and motor control centers (MCCs) are custom designed and built. This makes it impossible to have a one-fit-all layout design of an acoustic sensing system for these power distribution systems.

There is no known cost effective technology and product to detect loose electrical connections in electrical distribution systems. An infrared imaging scan has been widely used to find such loose electrical connections, but this does not provide continuous (e.g., "24-7" or 24 hours a day, seven days a week) detection and monitoring, is limited to detecting only joints within view, and exposes the operator to potentially hazardous conditions.

Other known products employ temperature sensing at each electrical joint. However, this has not been widely adopted due to cost.

It is believed to be almost impossible to extract a loose electrical connection signature from both current and voltage due to the relatively small voltage drop across a loose electrical connection (except when this escalates into a major arc fault or arc flash event) except by monitoring voltage drops at each electrical connection.

U.S. Pat. No. 7,148,696 discloses that an acoustic signature is generated by an arc fault or a glowing contact. An acoustic sensor "listens" directly to signature noise generated by a fault, no matter what type of electrical load is present or in what kind of environment in which the fault is generated. The acoustic noise generated by an arc fault or a glowing contact has an acoustic signal at one or more specific wavelengths that is (are) directly related to either the basic characteristics of, for example, the arc and its resonance frequency or the AC power source modulated frequency and its harmonics. The acoustic signal of an arc fault is detected by an acoustic sensor. A resulting trip signal is sent to a trip mechanism to, for example, trip open separable contacts, in order to interrupt the arc fault.

U.S. Pat. No. 7,411,403 discloses a circuit breaker that detects a loose electrical connection condition of a power circuit. The circuit breaker includes first and second lugs, and first and second acoustic couplers acoustically coupled to the power circuit. An acoustic generator is coupled to the second acoustic coupler and generates a first acoustic signal to the power circuit from the second acoustic coupler. An acoustic sensor is coupled to the first acoustic coupler and has a second acoustic signal which is operatively associated with the loose electrical connection condition. The acoustic sensor outputs a sensed acoustic signal. A circuit cooperates with the acoustic generator to generate the first acoustic signal, input the sensed acoustic signal, and detect the loose electrical connection condition therefrom. The circuit can output a trip signal to a trip mechanism upon detecting an electrical conductivity fault from the sensed acoustic signal.

There is room for improvement in electrical distribution systems.

SUMMARY

These needs and others are met by embodiments of the disclosed concept, which employs acoustic sensors, an acoustic transmitter and/or an acoustic signature simulator to sense noise signals corresponding to electrical conductivity faults and/or to mimic acoustic noise induced by electrical conductivity faults.

In accordance with one aspect of the disclosed concept, an acoustic sensor system comprises: a first plurality of acoustic sensors; and an acoustic transmitter structured to generate acoustic noise to mimic acoustic noise induced by an electrical conductivity fault, wherein a smaller second number of acoustic sensors of the first plurality of acoustic sensors are structured to identify a plurality of locations in an electrical distribution system having a plurality of electrical joints, in order that the smaller second number of acoustic sensors can monitor all of the plurality of electrical joints of the electrical distribution system.

At least one of the first plurality of acoustic sensors may be structured to be enabled as the acoustic transmitter with a high voltage pulse circuit.

The acoustic transmitter may be structured to be moved to a plurality of different locations in the electrical distribution system.

As another aspect of the disclosed concept, an acoustic signature simulator comprises: a pulse repetition rate control circuit structured to output a plurality of first pulses at one of a number of repetition rates; a voltage pulse generating circuit structured to output a plurality of second voltage pulses responsive to the plurality of first pulses; an acoustic generator structured to output a plurality of mechanical pulses responsive to the plurality of second voltage pulses; and an interface structured to couple the plurality of mechanical pulses to an electrical power conductor.

As another aspect of the disclosed concept, an electrical distribution system comprises: a plurality of electrical conductors comprising a plurality of electrical joints; a plurality of circuit interrupters, each of the circuit interrupters being electrically interconnected with a number of the plurality of electrical conductors; and a plurality of acoustic sensors, wherein the plurality of electrical conductors form a common bus structure, and wherein each of the plurality of acoustic sensors is coupled to a corresponding one of the plurality of electrical conductors, covers a number of the electrical joints of the corresponding one of the plurality of electrical conductors, and is structured to sense a noise signal corresponding to an electrical conductivity fault of the number of the electrical joints.

Each of a plurality of the plurality of acoustic sensors may sense a corresponding noise signal. Location of the electrical conductivity fault may be defined by the corresponding noise signal being the strongest noise signal of the plurality of the plurality of acoustic sensors.

BRIEF DESCRIPTION OF THE DRAWINGS

A full understanding of the disclosed concept can be gained from the following description of the preferred embodiments when read in conjunction with the accompanying drawings in which.

DESCRIPTION OF THE PREFERRED EMBODIMENTS

Figure 1:
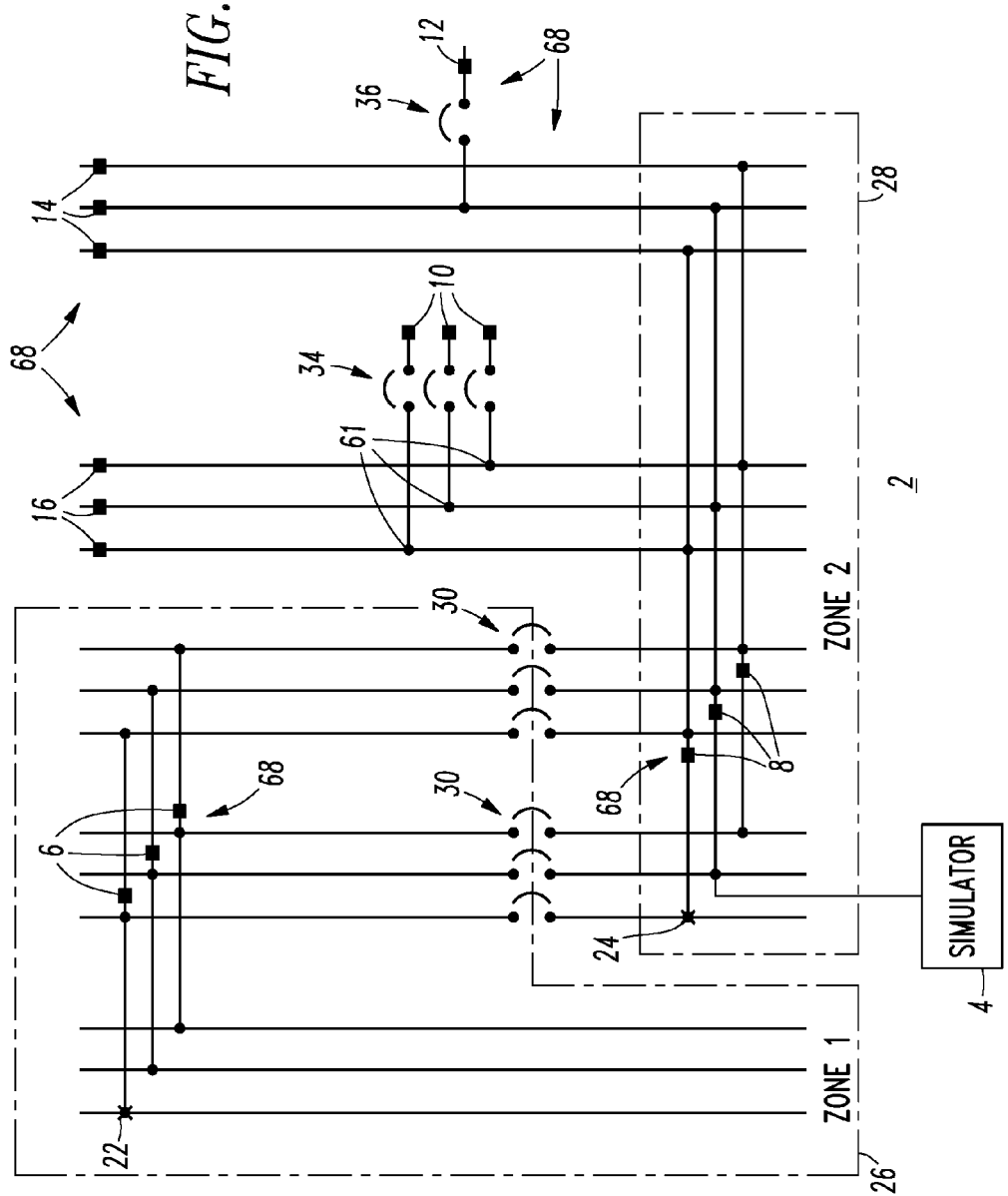
FIGS. 1-3 are block diagrams in schematic form of switchgear including an acoustic signature simulator and acoustic sensors in accordance with embodiments of the disclosed concept.

As employed herein, the term "number" shall mean one or an integer greater than one (i.e., a plurality).

As employed herein, the term "acoustic" shall mean one or more sounds that are subsonic, sonic and/or ultrasonic.

As employed herein, the term "electrical power conductor" shall mean a wire (e.g., solid; stranded; insulated; non-insulated), a copper conductor, an aluminum conductor, a suitable metal conductor, an electrical bus bar, or other suitable material or object that permits an electric current to flow easily.

As employed herein, the term "electrical joint" shall mean a structure that electrically and mechanically connects a plurality of electrical conductors.

As employed herein, the term "lug" shall mean a terminal or other electrically conductive fitting to which two or more electrical conductors are electrically and mechanically connected.

As employed herein, the term "electrical conductivity fault" shall mean an arc fault, or a loose or other intermittent electrical connection of an electrical conductor, an electrical joint and/or a lug that leads to a glowing contact.

As employed herein, the statement that two or more parts are "connected" or "coupled" together shall mean that the parts are joined together either directly or joined through one or more intermediate parts. Further, as employed herein, the statement that two or more parts are "attached" shall mean that the parts are joined together directly.

As employed herein, the term "acoustic coupler" shall mean a bolt; an adhesive; a clamp; a fastener; or another suitable coupling mechanism to hold an electrical conductor and an acoustic sensor or an acoustic generator together to allow effective acoustic transmission with or without an electrical connection.

As employed herein, the term "signature" shall mean something that serves to set apart or identify another thing. For example, an acoustic signature serves to set apart or identify an electrical conductivity fault.

As employed herein, the term "fastener" shall mean rivets, adhesives, screws, bolts and the combinations of bolts and nuts (e.g., without limitation, lock nuts) and bolts, washers and nuts.

As employed herein, the term "bolt" shall mean a device or apparatus structured to bolt two or more parts together so as to hold them firmly, such as by bolting an electrical power conductor and a housing including an insulation spacer. A bolt can be, for example, a metal rod or pin for fastening objects together that usually has a head at one end and a screw thread at the other end and is secured by a nut.

As employed herein, the term "clamp" shall mean a device or apparatus structured to bind or constrict or to press two or more parts together so as to hold them firmly, such as by holding or compressing an electrical power conductor and an insulation spacer. The term "clamp" expressly excludes a fastener.

The disclosed concept is described in association with, for example and without limitation, three-phase electrical distribution equipment and systems, such as low voltage switchgear, low voltage switch boards, low voltage panel boards, motor control centers and medium voltage switchgear. However, it will be appreciated that the disclosed concept can be employed with a wide range of other applications, such as busway electrical systems for commercial or industrial facilities, aerospace applications, and electric vehicle applications. Also, the disclosed concept is not limited to three-phase applications and can be applied to residential or other single-phase applications. In residential applications, the acoustic signal has a relatively high attenuation rate with relatively small electrical conductors; hence, each acoustic sensor can cover only a relatively short range of the electrical wiring system.

FIG. 1 shows an electrical distribution system, such as switchgear 2, including an acoustic signature simulator 4 and acoustic sensors 6,8,10,12,14,16. As will be discussed in connection with FIG. 4, the example acoustic signature simulator 2 includes an acoustic generator, such as a piezoelectric acoustic transmitter 18, to generate an acoustic signal 20 that mimics an acoustic signal of an electrical conductivity fault, such as an arc fault, a glowing contact or a loose electrical connection that leads to a glowing contact, such as 22 or 24 of FIGS. 1 and 2. Alternatively, any suitable electrical, mechanical or electro-mechanical acoustic generator, or magnetostrictive device can be employed to simulate acoustic noise generated by an electrical conductivity fault (e.g., the generated acoustic signal wavelet resembles that induced by an electrical conductivity fault with a repetitive rate of a power frequency or its harmonics). As will be explained, the example piezoelectric acoustic transmitter 18 can be coupled to different locations of an electrical distribution system, such as the example switchgear 2, to determine where acoustic sensors, such as 6,8,10,12,14,16, should be positioned, in order to provide complete detection coverage for loose electrical connections 22,24 of respective zones 26,28.

In the example switchgear 2, circuit interrupters, such as circuit breakers 30,34,36, act as isolators or absorbers of acoustic signals since, for example, the braided flexible conductor or shunt (not shown) electrically connecting the movable contact arm (not shown) and the circuit breaker load side conductor (not shown) acts like an acoustic isolator due to the relatively high attenuation rate of the acoustic signal when it goes through the shunt. Hence, an acoustic signal from the load (line) side cannot pass through the circuit breaker to reach to the line (load) side. Since the shunt is an acoustic attenuator, any acoustic signal, regardless if generated from an actual loose electrical connection or a simulator, will not pass through the circuit breaker, thus dividing the switchgear 2 into acoustically isolated zones, such as 26,28.

The example circuit breaker 34 is a three-pole circuit breaker. The example circuit breaker 30 is a six-pole circuit breaker with two poles paralleled per phase. However, it will be appreciated that a three-pole circuit breaker could be employed.

As will be explained, the example piezoelectric acoustic transmitter 18 of FIG. 4 can be part of a suitable acoustic sensor (e.g., without limitation, a piezoelectric sensor), such as acoustic sensors 6,8,10,12,14,16. In the example switchgear 2, each phase employs a corresponding piezoelectric acoustic sensor. So, for instance, for a three-phase system, there are three acoustic sensors, one for each phase.

In FIG. 1, the loose electrical connection 24 is detected by sensor 8 in zone 28 (zone #2). Similarly, the acoustic signal 20 (FIG. 4) from acoustic signature simulator 4 can also detected by sensor 8 in zone 28. However, the loose electrical connection 22 is not detected by sensor 8 due to blocking by circuit breaker 30. Sensors 14,16 by themselves are unable to detect the loose electrical connection 24 due to the attenuation of the acoustic signal, or may not be able to confirm that the loose electrical connection 24 is in zone 28 (zone #2) due to the relatively low level of noise detected by those sensors 14,16 when compared with the relatively higher level of noise detected by sensor 8 in zone 28.

Figure 2:
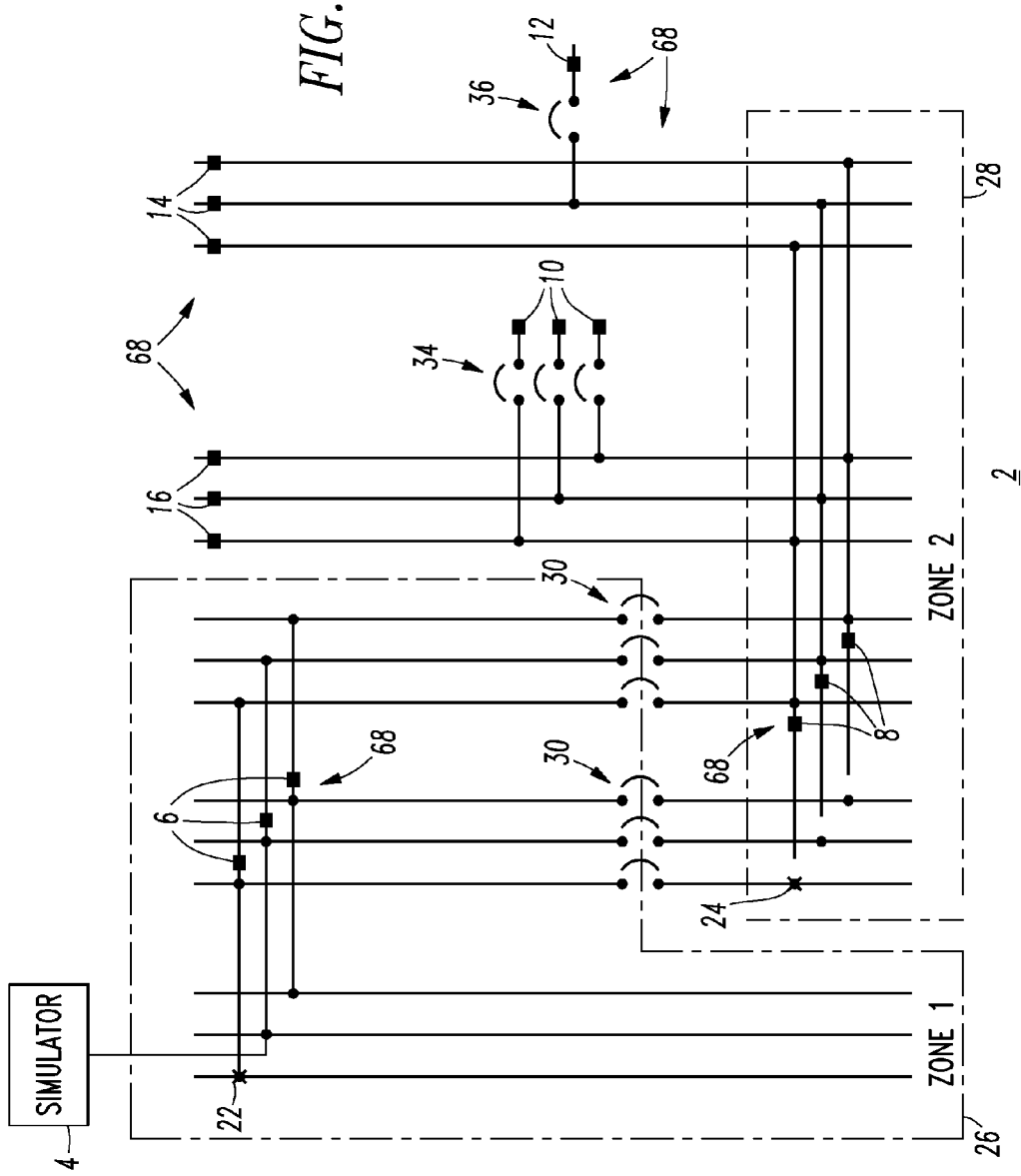
Figure 3:
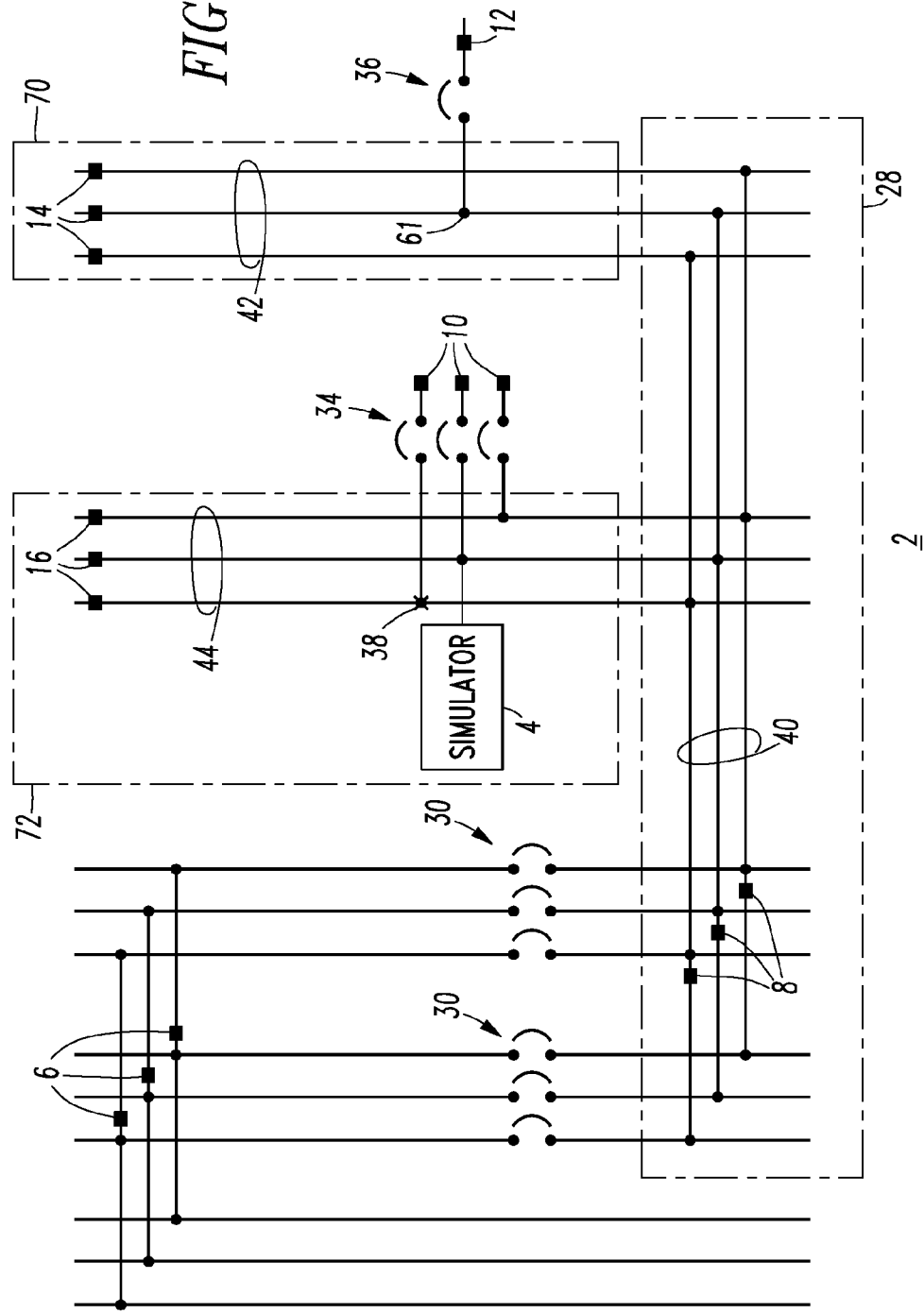

FIGS. 2 and 3 show variations of how the example switchgear 2 works in terms of the simulator 4, the example zones 26,28, the example acoustic sensors 6,8 and the circuit breaker 30 (that provides acoustic isolation). This can either use the simulator 4 to optimize locations of the sensors 6,8, 10,12,14,16, or use the sensors 6,8 to detect locations of loose electrical connections 22,24.

In FIG. 2, the simulator 4 is moved to a different location; otherwise, the switchgear 2 is the same as the switchgear 2 shown in FIG. 1. The loose electrical connection 22 is detected by sensor 6 in zone 26 (zone #1). However, the loose electrical connection 22 is not detected by sensors 8,10,12, 14,16 due to blocking by circuit breaker 30, and is not detected by sensors 10,12 due to further blocking by circuit breakers 34,36.

In FIG. 3, the simulator 4 is moved to a different location; otherwise, the switchgear 2 is the same as the switchgear 2 shown in FIG. 1. The location of loose electrical connection 38 can be "pinpointed" through "triangulation". Loose electrical connection 38 can be detected and located by comparing measured noise values by sensors 8,14,16. For example, sensor 16 will measure the strongest noise signal, followed by sensor 8 and then by sensor 14. Hence, the loose electrical connection 38 can be confirmed to be part of the common bus structure formed by three-phase buses 40,42,44 shared by those respective sensors 8,14,16, but in relatively closer proximity to sensor 16 on bus 44 rather than sensors 8 or 14 on respective buses 40 or 42.

Figure 4:
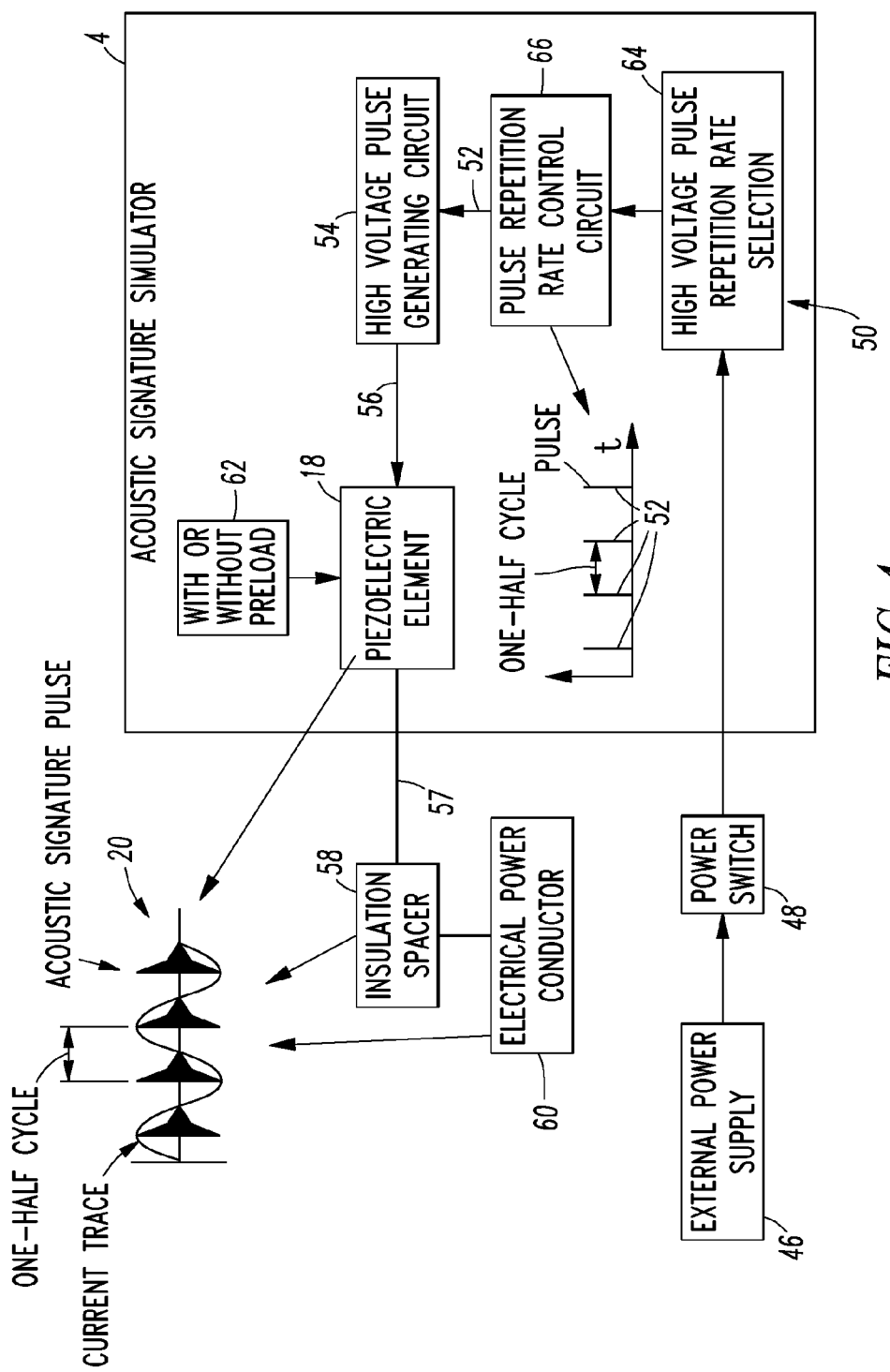
FIG. 4 is a block diagram of the acoustic signature simulator of FIG. 1.

FIG. 4 shows the example acoustic signature simulator 4 of FIGS. 1-3. The simulator 4 including the circuit 50 can be powered by an external power supply 46 through a power switch 48, as shown. For example, the power lines may not be energized during testing. As a non-limiting example, a battery can be employed as the power supply 46. The circuit 50 provides a number of repetition rates of electronic pulses 52. The pulses 52 trigger a voltage pulse generating circuit 54 at a number of suitable voltages (e.g., without limitation, 150V; 400V; any suitable voltage to provide a suitable acoustic pulse amplitude). The output voltage pulses 56 drive the example piezoelectric element 18 to generate mechanical pulses 57 through a suitable interface, such as insulation spacer 58 (e.g., without limitation, a ceramic disk), onto a suitable electrical power conductor, such as bus bar or electrical cable 60, in order to simulate a plurality of acoustic signals 20 induced by loose electrical connections (e.g., without limitation, overheated electrical joints (not shown, but see electrical joints 61 and loose electrical connections 22,24,38 of FIGS. 1-3)). The example insulation spacer 58 is disposed between the example piezoelectric element 18 (or a piezoelectric element housing (not shown)) and the example bus bar 60. The optional "preload" 62 of the example piezoelectric element 18 (or of a corresponding acoustic sensor) optionally compresses the piezoelectric element 18 under pressure in its assembly. Hence, the example piezoelectric element 18 can either be preloaded to the example insulation spacer 58, or is not preloaded thereto. The circuit 50 can include a selection circuit 64 that selects one of a plurality of different high voltages, and a control circuit 66 that provides the electronic pulses 52 at a suitable repetition rate, such as, for example, that of a line frequency.

The example acoustic signature simulator 4 includes the pulse repetition rate control circuit 66 structured to output the first pulses 52 at one of a number of repetition rates, the voltage pulse generating circuit 54 structured to output the second voltage pulses 56 responsive to the first pulses 52, the example piezoelectric element 18 structured to output the mechanical pulses 57 responsive to the second voltage pulses 56, and the interface 58 structured to couple the mechanical pulses 57 to the electrical power conductor 60.

The voltage pulse generating circuit 54 can be structured to output the second voltage pulses 56 at a plurality of different voltages (e.g., without limitation, 150V, 400V, any suitable voltage). For example, this can simulate an acoustic signal induced by a loose connection at different locations, different current levels, or even just a variation of acoustic signals generated by the same loose connection. This can include multiple voltages at the same time to simulate the variation of an acoustic signal from a loose electrical connection or just one selected voltage.

The pulse repetition rate control circuit 66 can be structured to select one of a plurality of different repetition rates (e.g., without limitation, corresponding to 50 Hz, 60 Hz, 85 Hz, 120 Hz, 135 Hz, 400 Hz, harmonics and sub-harmonics of the line frequency, any suitable frequency). This can be employed to, for example and without limitation, test an acoustic sensor's detection capability and nuisance detection performance. This can permit a wide range of power line applications (e.g., 60 Hz in the United States; 50 Hz in Europe and Asia; 400 Hz for aerospace applications). Also, the selection of various repetition rates permit testing whether an acoustic sensor can detect and use no frequency other than the power line frequency and its harmonics in order to make sure that it does not cause nuisance tripping.

As shown in FIG. 4, the example acoustic piezoelectric transmitter 18 can be structured to generate acoustic pulses conducting through electrical power conductors, such as bus bars and/or power cables, at a frequency from about 10 kHz to about 40 kHz modulated by a line frequency. The line frequency can be selected from the group consisting of about 50 Hz, about 60 Hz, about 400 Hz, and harmonics or sub-harmonics of the line frequency.

As shown with respect to FIGS. 1-3, the acoustic signature simulator 4 can be moved to a plurality of different locations, such as the example zones 26,28, in the switchgear 2. Alternatively, any number of the example acoustic sensors 6,8,10, 12,14,16 for electrical conductivity fault detection can be enabled as an acoustic transmitter with the high voltage pulse circuit 54 of FIG. 4. When the piezoelectric element (not shown, but see the example piezoelectric element 18 of FIG. 4) of the corresponding acoustic sensor experiences stress and strain, it generates a voltage output. In this case, it is employed as a sensor. However, when a voltage, such as 56, is applied across the example piezoelectric element 18, the dimension of the example piezoelectric element changes. This characteristic can be used as an acoustic transmitter or generator. For example and without limitation, the example high voltage pulse generating circuit 54 can be integrated into the electronic circuitry of the acoustic sensors 6,8,10,12,14, 16 in order to generate a simulated electrical conductivity fault acoustic signal 20.

Referring again to FIG. 1, an acoustic sensor system 68 includes a first plurality of acoustic sensors 6,8,10,12,14,16, and an acoustic transmitter, such as the example piezoelectric transmitter 18 of FIG. 4, structured to generate the acoustic noise 20 to mimic acoustic noise induced by an electrical conductivity fault, such as 22, 24 or 38 (FIG. 3). A smaller second number of the acoustic sensors, such as for example and without limitation one acoustic sensor 6, one acoustic sensor 8, or three acoustic sensors 8,14,16, are structured to identify a plurality of locations in the switchgear 2, in order that such second number of acoustic sensors can monitor all of the plurality of electrical joints 61 thereof.

As shown in FIG. 3, the example acoustic sensors 8,14,16 are coupled to respective bus bars 40,42,44 at a plurality of locations in the switchgear 2. Each of the acoustic sensors 8,14,16 can cover a number of the electrical joints 61 of a corresponding zone 28,70,72, respectively, of the switchgear 2. For example, the sensor 14 can cover the joint 61 of the zone 70, and the sensor 16 can cover the joints 61 (shown in FIG. 1) of the zone 72. The example zone 28 is defined by the circuit interrupters 30,34,36 that block acoustic propagation. The example zone 26 of FIG. 1 is defined by the circuit interrupter 30 that blocks acoustic propagation.

In order to provide complete detection coverage of electrical conductivity faults and their zone location in electrical distribution systems, such as, for example, switchgears, MCCs, switchboards and panel boards, the disclosed concept allows effective and quick determination of where acoustic sensors should be located in a new electrical distribution system. The disclosed acoustic signature simulator generates a simulated acoustic signal that has the same characteristics as that of glowing contacts and is easy to move around in the electrical distribution system.

Figure 5:
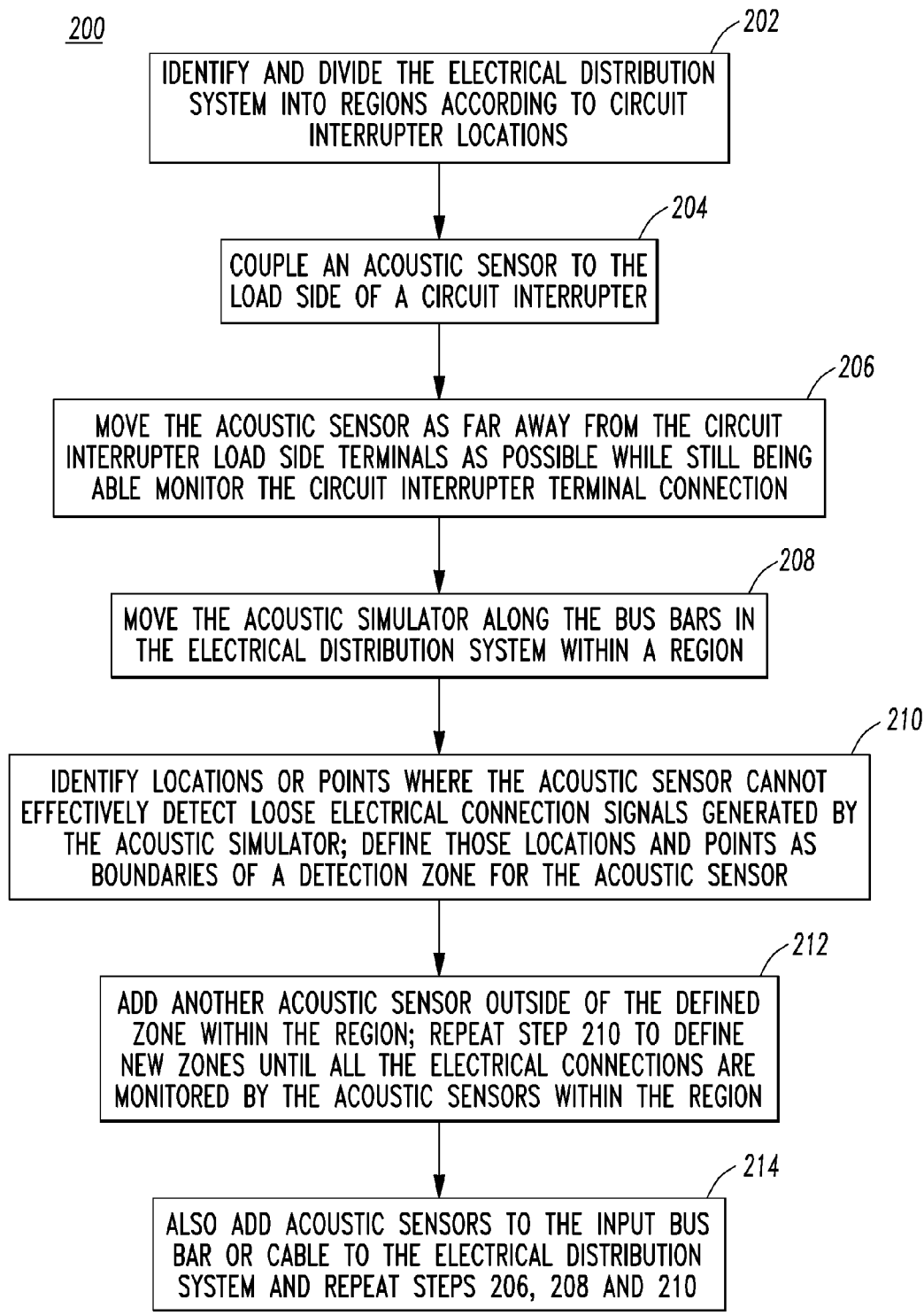
FIG. 5 is a flowchart of a process for acoustic sensor distribution optimization.

Referring to FIG. 5, a process 200 for sensor distribution optimization is shown. This process 200 can be applied to an electrical distribution system, such as the example switchgear 2, acoustic signature simulator 4, acoustic sensors 6,8,10,12, 14,16, zones 26,28 and circuit interrupters 30,34,36 of FIGS. 1-3.

First, at 202, identify and divide the electrical distribution system into regions according to circuit interrupter locations. Then, at 204, couple an acoustic sensor to the load side of a circuit interrupter. Next, at 206, move the acoustic sensor as far away from the circuit interrupter load side terminals as possible while still being able to monitor the circuit interrupter terminal connection with the acoustic sensor. Then, at 208, move the acoustic simulator along the bus bars in the electrical distribution system within a region. Next, at 210, identify locations or points where the acoustic sensor cannot effectively detect loose electrical connection signals generated by the acoustic simulator; and define those locations and points as boundaries of a detection zone for the acoustic sensor. Then, at 212, add another acoustic sensor outside of the defined zone within the region; and repeat step 210 to define new zones until all the electrical connections are monitored by the acoustic sensors within that region. Finally, at 214, also add acoustic sensors to the input bus bar or cable to the electrical distribution system and repeat steps 206, 208 and 210.

As will be discussed in connection with FIGS. 6-8, at least one of the acoustic sensors, such as 6,8,10,12,14,16 of FIG. 1, and/or the simulator 4 of FIG. 1, can be structured to clamp-on an electrical power conductor, such as 60 of FIG. 4.

Figure 6:
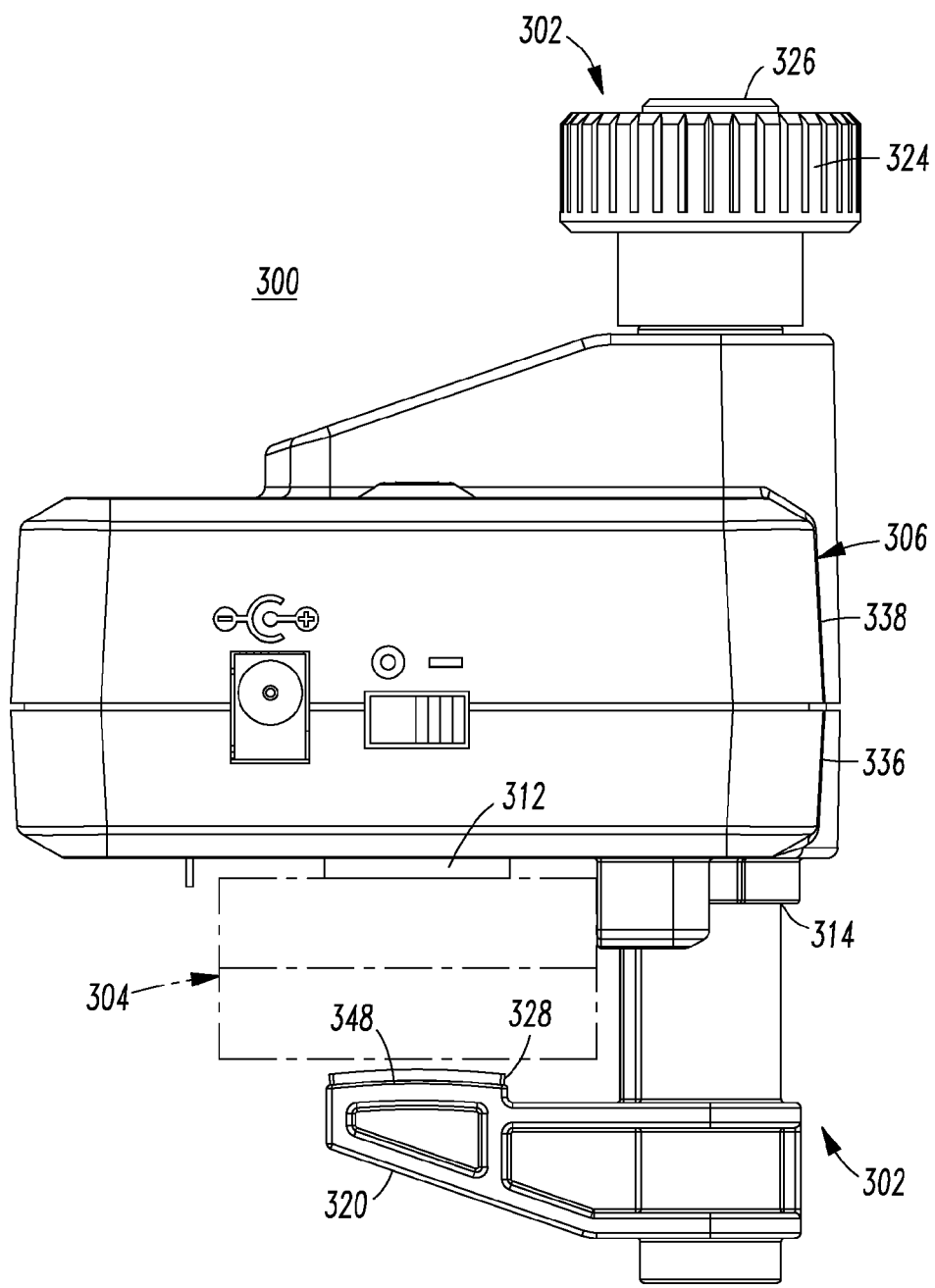
FIG. 6 is a vertical elevation view of an acoustic sensor including a clamp-on structure for a rectangular power bus bar in accordance with another embodiment of the disclosed concept.
Figure 7:
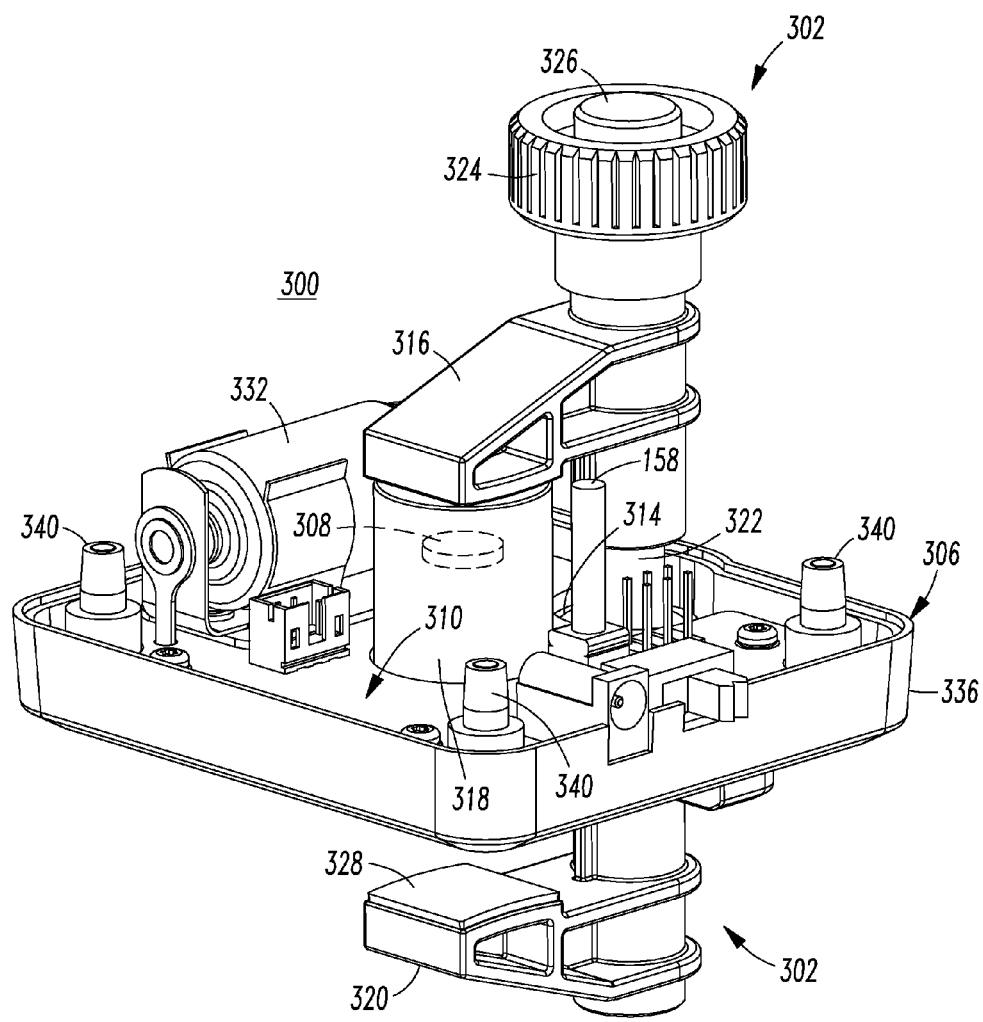
FIG. 7 is an isometric view of the acoustic sensor of FIG. 6 except with the cover removed to show internal structures.

Referring to FIGS. 6 and 7, an acoustic sensor apparatus 300 includes a clamp, such as the example clamp-on structure 302, for an electrical power conductor, such as the example rectangular power bus bar 304 (shown in phantom line drawing in FIG. 6). The example acoustic sensor apparatus 300 also includes a housing 306 for an acoustic sensor and/or an acoustic generator, such as a low cost piezoelectric element 308 (shown in hidden line drawing in FIG. 7) housed within the housing 306, and a printed circuit board (PCB) 310 (FIG. 7), which can include the example circuit 50 of FIG. 4. The housing 306 is clamped onto power bus bar 304 or another power conductor in an electrical system (not shown).

As shown in FIG. 6, the exterior of the housing 306 includes an insulation spacer 312, which is coupled to the stainless steel cylindrical canister 318 wherein piezoelectric element 308 (shown in hidden line drawing) is disposed (FIG. 7). The clamp-on structure 302 is structured to clamp together the insulation spacer 312 and the example power bus bar 304 along with the housing 306.

The housing 306 can be, for example and without limitation, a metallic housing or an insulative housing having an internal and/or external metal coating structured to provide EMI shielding. The metal coating can be, for example and without limitation, a suitable thin film metal coating.

As is best shown in FIG. 7, the example clamp-on structure 302 is disposed through opening 314 of the housing 306. The clamp-on structure 302 includes a first insulative clamp portion 316 disposed within the housing 306 and engaging a stainless steel cylindrical canister 318 that houses the piezoelectric element 308 (shown in hidden line drawing) therein, a second insulative clamp portion 320 disposed outside of the housing 306 and being structured to engage the power bus bar 304 (FIG. 6), and a threaded coupler, such as the example threaded dowel 322, passing through the first clamp portion 316 and through the housing 306. The threaded dowel 322 has a first end and an opposite second threaded end (shown in FIG. 8) threadably coupled to the second clamp portion 320 (as shown with the second clamp portion 320' in FIG. 8).

A rotatable member, such as the example circular, insulative fastening knob 324, is coupled to and structured to rotate along the threaded dowel 322 in order to move up or down to pull or push the second clamp portion 320 and clamp or unclamp, respectively, the housing 306, the power bus bar 304 and the second clamp portion 320. An insulative screw cap 326 keeps the knob 324 from rotating off the first end of the threaded dowel 322.

Preferably, the second clamp portion 320 has an insulative cushion 328 structured to insulatively engage the power bus bar 304.

The piezoelectric element 308 is within the example 0.5" diameter stainless steel cylindrical canister 318 and is coupled to the bottom of the canister 318, which is opposite the side of the insulative spacer 312 (e.g., a ceramic disk) (FIG. 6).

As shown in FIG. 7, the example acoustic sensor apparatus 300 includes a fault indicator 158, which can be an LED indicator (e.g., without limitation, green flashing for normal operation; red flashing for detection of an electrical conductivity fault operatively associated with the power bus bar 304). An on/off switch 330 can enable or disable a power supply (not shown), which can include a battery 332 as shown in FIG. 7. Also, the power supply can accept DC power from an external AC/DC or DC/DC power supply (not shown) through DC power input 334.

As can be seen from FIGS. 6 and 7, the example housing 306 includes a base 336 and a cover 338. The base 336 includes posts 340, which engage corresponding structures (not shown) of the cover 338.

Figure 8:
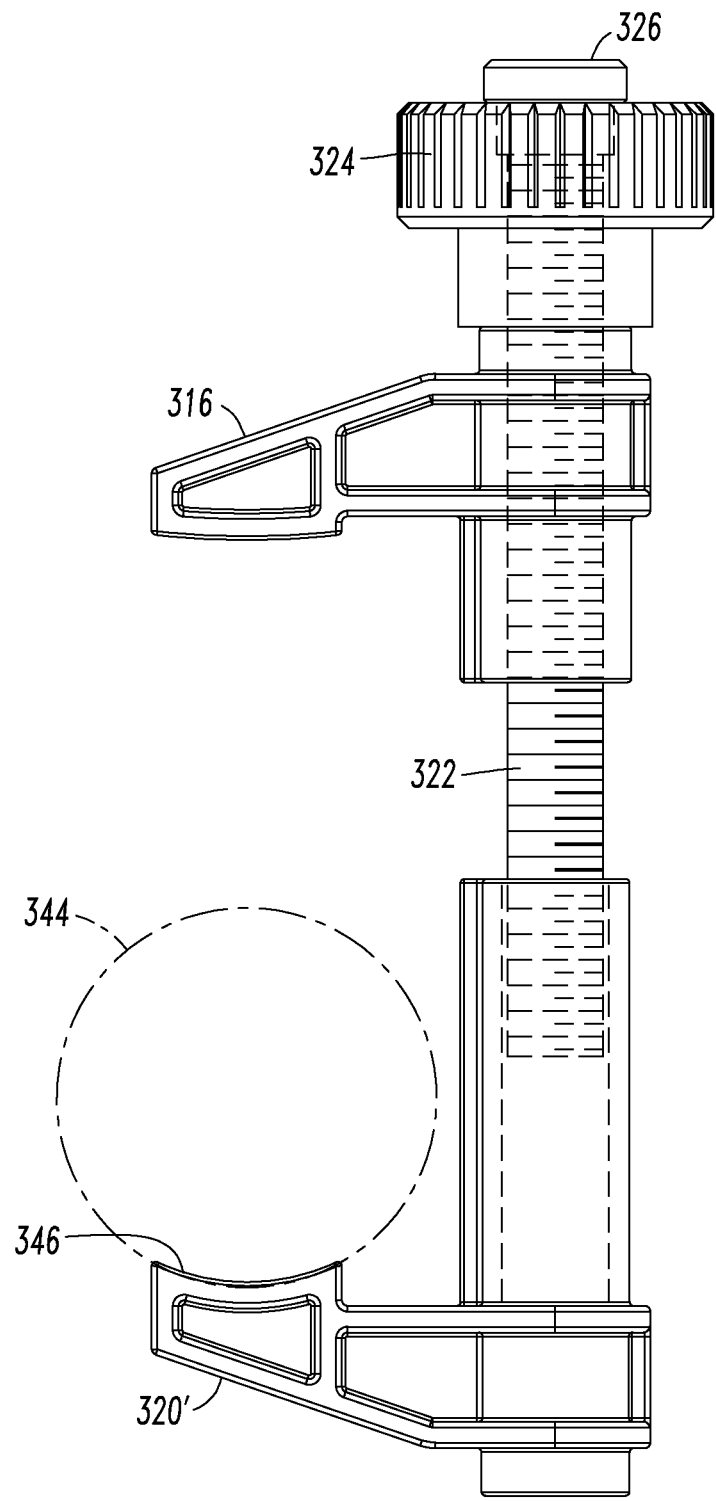
FIG. 8 is a vertical elevation view of a clamp-on structure for a power conductor and an acoustic sensor in accordance with another embodiment of the disclosed concept.

Referring to FIG. 8, another clamp-on structure 342 is for a power conductor 344 (shown in phantom line drawing in FIG. 8) and another acoustic sensor apparatus (not shown), which, except for the clamp-on structure 342, can be the same as or similar to the acoustic sensor apparatus 300 of FIGS. 6 and 7. The second clamp portion 320' is somewhat different than the second clamp portion 320 of FIG. 6. In particular, the clamp surface 346 is a concave arcuate surface to accommodate the circular or elliptical cross section of the power conductor 344. Conversely, the second clamp portion 320 of FIG. 6 has a flat, generally flat or somewhat convex surface 348 to accommodate the planar surface of the power bus bar 304. In this example, no insulative cushion is employed since electrical cables usually have insulative sleeves thereon. Otherwise, the clamp-on structure 342, like the clamp-on structure 302, can clamp together a housing, such as 306, the power conductor 344, and optionally an insulative spacer, such as 312.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. An acoustic sensor system comprising:
   a first plurality of acoustic sensors; and
   an acoustic transmitter structured to generate acoustic noise to mimic acoustic noise induced by an electrical conductivity fault with a repetitive rate of a power frequency or its harmonics,
   wherein a smaller second number of acoustic sensors of said first plurality of acoustic sensors are structured to identify a plurality of locations in an electrical distribution system having a plurality of electrical joints, in order that said smaller second number of acoustic sensors monitor all of the plurality of electrical joints of said electrical distribution system.

2. The acoustic sensor system of claim 1 wherein said acoustic transmitter is a piezoelectric transmitter.

3. The acoustic sensor system of claim 1 wherein said smaller second number of acoustic sensors are a second plurality of acoustic sensors coupled to a plurality of bus bars at the plurality of locations in the electrical distribution system having the plurality of electrical joints, in order that each of said second plurality of acoustic sensors covers a number of the electrical joints of a corresponding zone of said electrical distribution system.

4. The acoustic sensor system of claim 3 wherein the corresponding zone of said electrical distribution system is defined by a number of circuit interrupters that block acoustic propagation.

5. The acoustic sensor system of claim 1 wherein at least one of said first plurality of acoustic sensors is structured to be enabled as said acoustic transmitter with a high voltage pulse circuit.

6. The acoustic sensor system of claim 1 wherein said acoustic transmitter is structured to be moved to a plurality of different locations in said electrical distribution system.

7. The acoustic sensor system of claim 1 wherein said acoustic transmitter is structured to generate acoustic pulses in an electrical power conductor of said electrical distribution system at a frequency about 10 kHz to about 40 kHz modulated by a line frequency.

8. The acoustic sensor system of claim 7 wherein said line frequency is selected from the group consisting of about 50 Hz, about 60 Hz, about 400 Hz, and harmonics or sub-harmonics of said line frequency.

9. The acoustic sensor system of claim 1 wherein said electrical conductivity fault is selected from the group consisting of an arc fault, a loose or other intermittent electrical connection of an electrical conductor, and an electrical joint and/or a lug that leads to a glowing contact.

\* \* \* \* \*